(12) United States Patent
Furuhashi et al.

(10) Patent No.: US 9,384,829 B2
(45) Date of Patent: Jul. 5, 2016

(54) MEMORY DEVICE

(71) Applicant: KABUSHIKI KAISHA TOSHIBA, Minato-ku, Tokyo (JP)

(72) Inventors: Hironobu Furuhashi, Mie-ken (JP); Iwao Kunishima, Mie-ken (JP); Susumu Shuto, Kanagawa-ken (JP); Yoshiaki Asao, Kanagawa-ken (JP); Gaku Sudo, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 488 days.

(21) Appl. No.: 13/847,677

(22) Filed: Mar. 20, 2013

(65) Prior Publication Data

US 2014/0185359 A1 Jul. 3, 2014

(30) Foreign Application Priority Data

Dec. 27, 2012 (JP) .................. 2012-284823

(51) Int. Cl.
*G11C 13/00* (2006.01)
*H01L 45/00* (2006.01)
*G11C 11/56* (2006.01)
*H01L 27/24* (2006.01)

(52) U.S. Cl.
CPC ........ *G11C 13/0002* (2013.01); *G11C 11/5678* (2013.01); *G11C 13/0004* (2013.01); *H01L 45/065* (2013.01); *H01L 45/1233* (2013.01); *H01L 45/144* (2013.01); *G11C 2213/71* (2013.01); *G11C 2213/72* (2013.01); *H01L 27/2409* (2013.01); *H01L 27/2481* (2013.01)

(58) Field of Classification Search
CPC . H01L 45/065; H01L 45/1233; H01L 45/143; H01L 45/144; G11C 13/0002; G11C 13/0004
See application file for complete search history.

(56) References Cited

U.S. PATENT DOCUMENTS

| 5,687,112 | A | 11/1997 | Ovshinsky | |
|---|---|---|---|---|
| 7,718,987 | B2 * | 5/2010 | Chong | ................... G11C 11/16 257/2 |
| 7,800,935 | B2 | 9/2010 | Maejima et al. | |
| 8,139,396 | B2 | 3/2012 | Kurosawa et al. | |
| 2001/0051508 | A1 | 12/2001 | Wang | |
| 2007/0065069 | A1 | 3/2007 | Bratkovski et al. | |
| 2009/0257274 | A1 | 10/2009 | Itagaki et al. | |

(Continued)

FOREIGN PATENT DOCUMENTS

| JP | 2010287744 A | 12/2010 |
|---|---|---|
| JP | 2012204507 A | 10/2012 |

OTHER PUBLICATIONS

Japanese Office Action (and English translation thereof) dated Oct. 23, 2015, issued in counterpart Japanese Application No. 2012-284823.

*Primary Examiner* — Allison P Bernstein
(74) *Attorney, Agent, or Firm* — Holtz, Holtz & Volek PC

(57) ABSTRACT

A memory device includes n (n being an integer of 2 or more) resistance change films being series connected to each other. Each of the resistance change films is a superlattice film in which plural pairs of a first crystal layer made of a first compound and a second crystal layer made of a second compound are alternately stacked. An average composition of the entire resistance change film or an arrangement pitch of the first crystal layers and the second crystal layers are mutually different among the n resistance change films.

8 Claims, 12 Drawing Sheets

(56) References Cited

U.S. PATENT DOCUMENTS

| | | |
|---|---|---|
| 2010/0020082 A1 | 1/2010 | Kumakura et al. |
| 2010/0200828 A1* | 8/2010 | Tominaga ............ B82Y 10/00 257/2 |
| 2010/0315867 A1 | 12/2010 | Aizawa et al. |
| 2012/0241707 A1 | 9/2012 | Takahashi |
| 2012/0294072 A1* | 11/2012 | Loke ................. G11C 11/5678 365/163 |
| 2014/0376307 A1* | 12/2014 | Shintani ............ G11C 13/0004 365/163 |

* cited by examiner

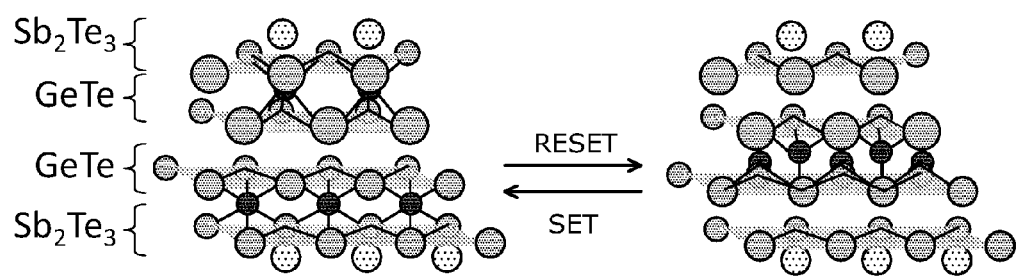
FIG. 4A
LOW RESISTANCE STATE
(COORDINATION NUMBER : 6)
FIG. 4B
HIGH RESISTANCE STATE
(COORDINATION NUMBER : 4)
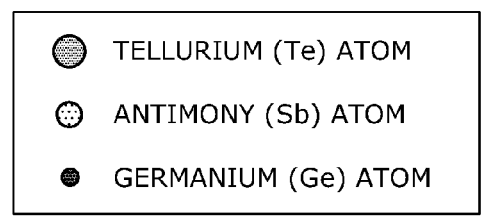

MEMORY DEVICE

CROSS-REFERENCE TO RELATED APPLICATIONS

This application is based upon and claims the benefit of priority from the prior Japanese Patent Application No. 2012-284823, filed on Dec. 27, 2012; the entire contents of which are incorporated herein by reference.

FIELD

Embodiments described herein relate generally to a memory device.

BACKGROUND

Recently, the memory device called PRAM (phase change random access memory) has been drawing attention. In PRAM, the microstructure of the recording layer is switched between the crystal phase and the amorphous phase, and the difference in electrical resistance value (hereinafter simply referred to as "resistance") between these phases is used to store data. However, regarding PRAM, the following problems have been pointed out. In PRAM, the recording layer is turned into the crystal phase by passing a current therein to heat it to a temperature less than the melting point. On the other hand, the recording layer is turned into the amorphous phase by passing a current therein to heat it to a temperature more than or equal to the melting point and then being quenched. Thus, a relatively large current is needed to write data. Furthermore, crosstalk due to heat transfer is likely to occur. Thus, it is difficult to increase the packing density of PRAM. Furthermore, the phase change between the crystal phase and the amorphous phase requires a certain period of time and results in slow operating speed. Moreover, it is difficult to form each phase uniformly. Thus, the current path varies for each time of phase change and results in the variation of resistance.

To solve these problems, a memory device with the recording layer made of a superlattice stacked body (interfacial phase change memory, iPCM) has been proposed. In iPCM, by injecting a current into the recording layer, constituent atoms in the superlattice stacked body are reversibly interchanged with the microstructure of the recording layer left in the crystal phase. Thus, the resistance of the recording layer is changed to store data. In such iPCM, the position of the constituent atom is microscopically changed with the crystallinity of the recording layer maintained. Thus, compared with the aforementioned PRAM, the amount of current needed to write data is smaller, and crosstalk due to heat transfer is less likely to occur. Furthermore, the time required for state change is shorter, and the current path is more likely to be stabilized. Because of these advantages, iPCM is suited for the increase of packing density and speed enhancement. However, even in iPCM, there is demand for further improvement in recording density.

BRIEF DESCRIPTION OF THE DRAWINGS

FIGS. 4A and 4B are molecular model diagrams illustrating a crystal structure of the resistance change film;

DETAILED DESCRIPTION

In general, according to one embodiment, a memory device includes n (n being an integer of 2 or more) resistance change films being series connected to each other. Each of the resistance change films is a superlattice film in which a plurality of pairs of a first crystal layer made of a first compound and a second crystal layer made of a second compound are alternately stacked. Average composition of the entire resistance change film or arrangement pitch of the first crystal layers and the second crystal layers are mutually different among the n resistance change films.

In general, according to another embodiment, a memory device includes a superlattice film capable of assuming a low resistance state and a high resistance state. A first region and a second region are arranged along direction of current flowing in the superlattice film, and between in the first region and in the second region, at least one of set current at which each region is transferred from the high resistance state to the low resistance state and reset current at which each region is transferred from the low resistance state to the high resistance state are mutually different.

In general, according to another embodiment, a memory device includes: n (n being an integer of 2 or more) resistance change films being series connected to each other and being mutually different in set current at which each resistance change film is transferred from a high resistance state to a low resistance state; and a control circuit configured to turn the n resistance change films into the high resistance state and then to selectively transfer the resistance change films into the low resistance state sequentially from the resistance change film having the smallest set current. The resistance change film with the set current being smaller has a larger difference between resistance in the high resistance state and resistance in the low resistance state.

In general, according to another embodiment, a memory device includes n (n being an integer of 2 or more) resistance change films being series connected to each other and being mutually different in reset current at which each resistance change film is transferred from a low resistance state to a high resistance state; and a control circuit configured to turn the n resistance change films into the low resistance state and then to selectively transfer the resistance change films into the high resistance state sequentially from the resistance change film having the smallest reset current. The resistance change film with the reset current being smaller has a smaller difference between resistance in the high resistance state and resistance in the low resistance state.

Embodiments of the invention will now be described with reference to the drawings.

First, a first embodiment is described.

Figure 1:
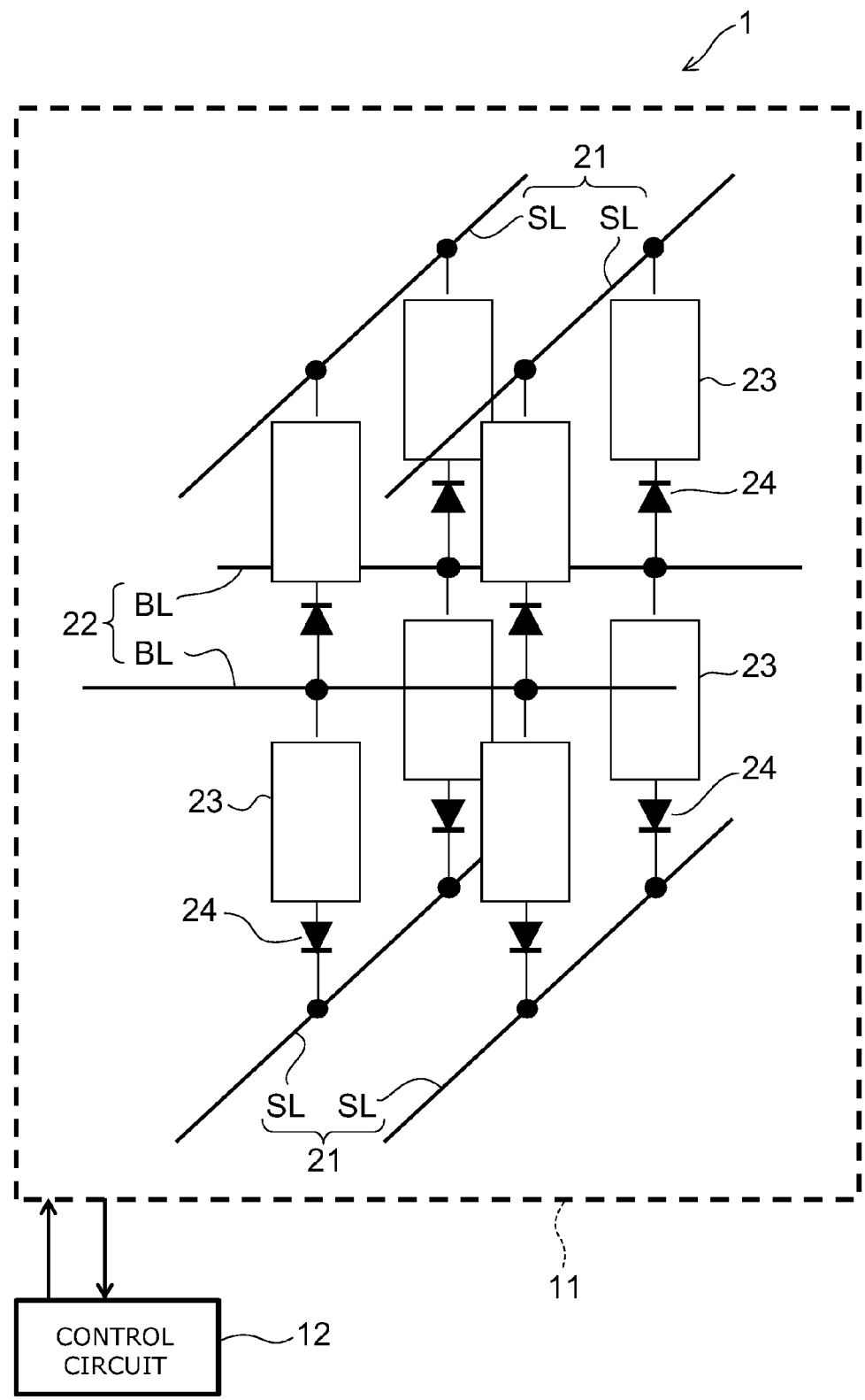
FIG. 1 illustrates a memory device according to an embodiment.

FIG. 1 illustrates a memory device according to this embodiment.

Figure 2:
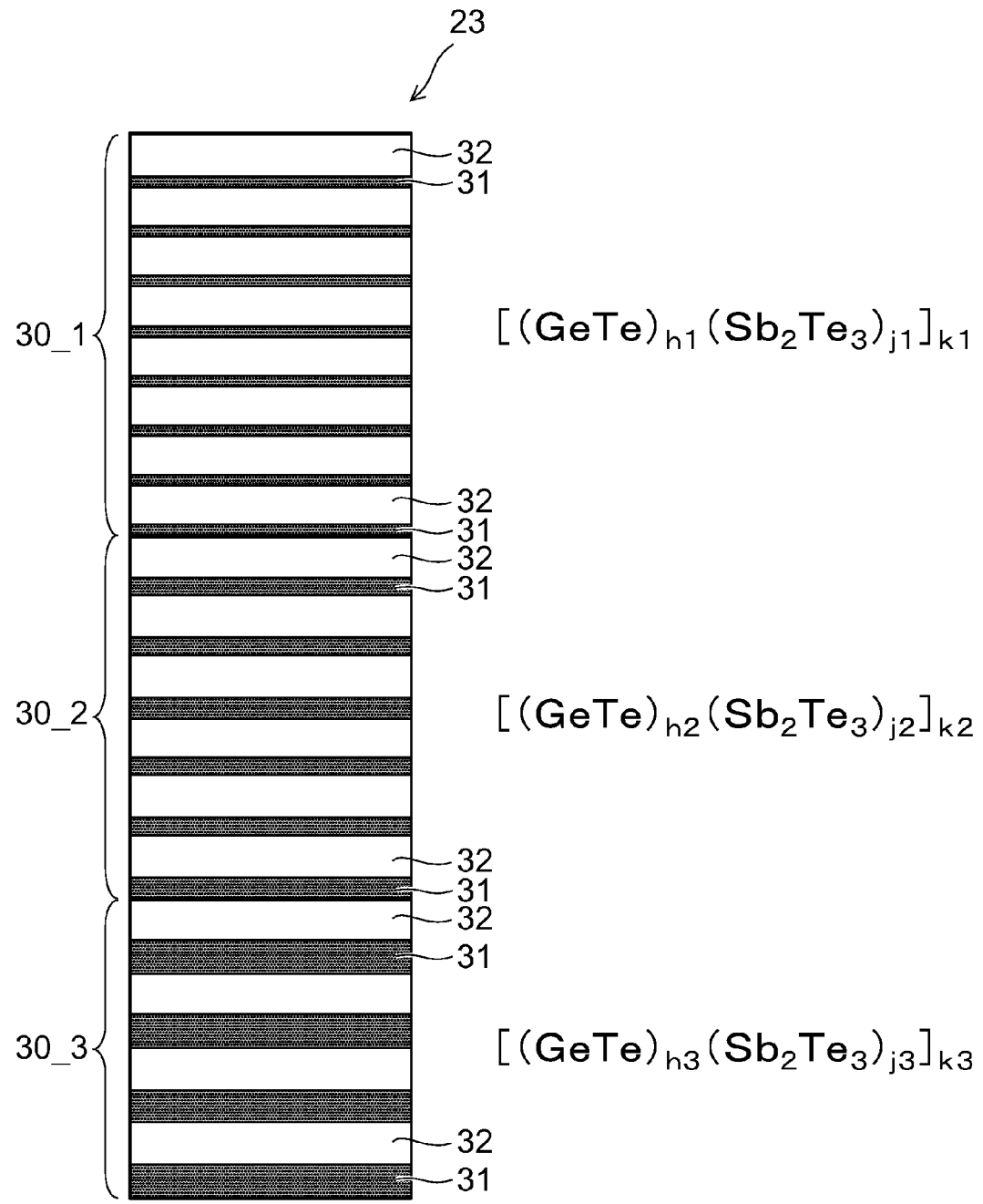
FIG. 2 is a sectional view illustrating a memory cell of the embodiment.

FIG. 2 is a sectional view illustrating a memory cell of this embodiment.

Figure 3:
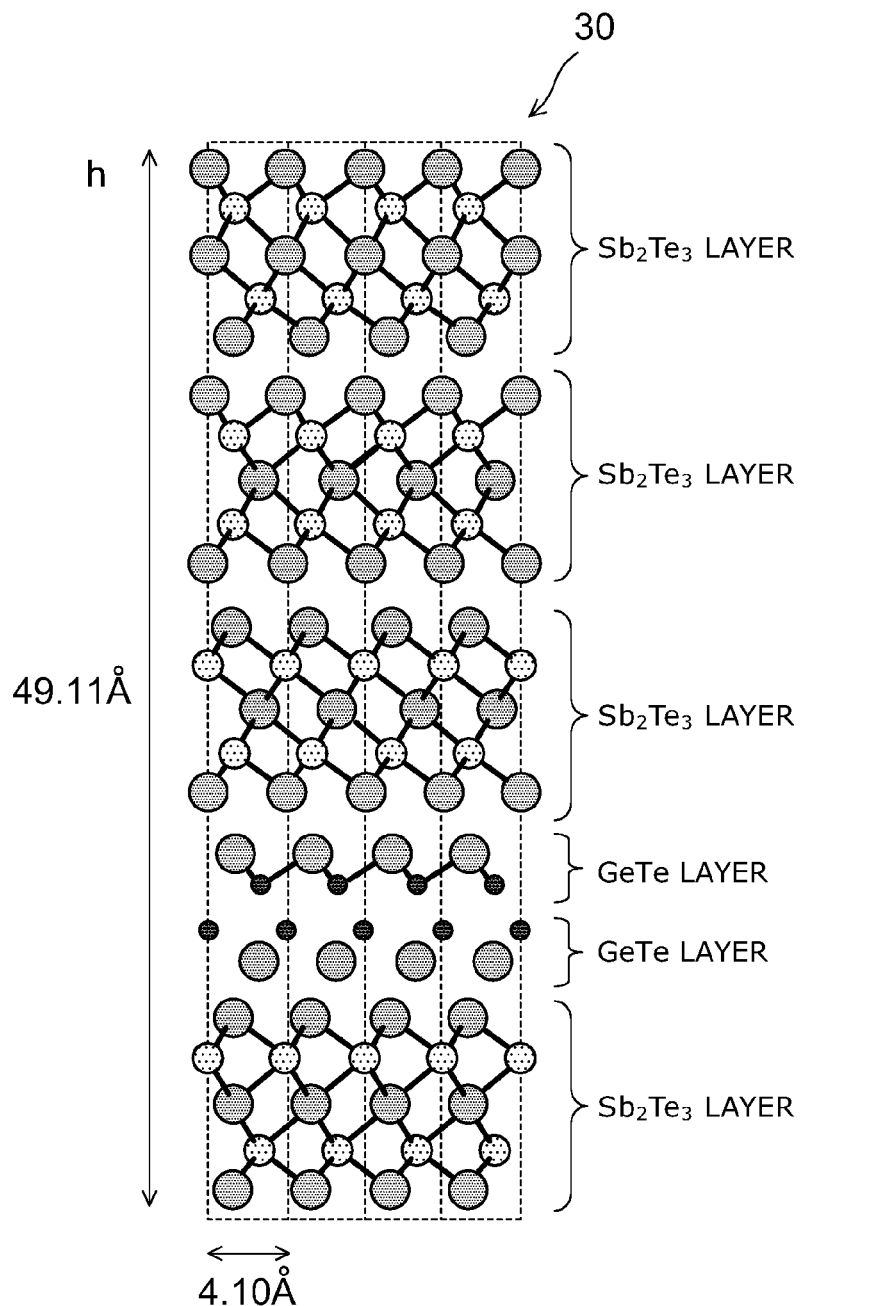
FIG. 3 is a molecular model diagram showing a crystal structure of a resistance change film.
Figure 3:
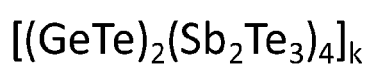
Figure 3:
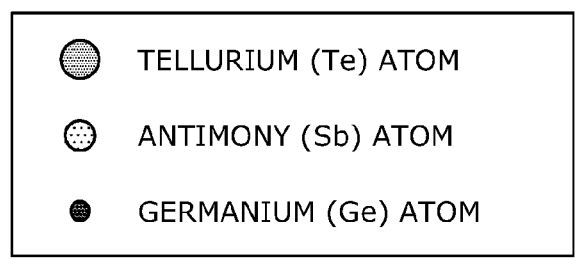

FIG. 3 is a molecular model diagram showing the crystal structure of a resistance change film.

As shown in FIG. 1, the memory device 1 according to this embodiment includes a memory section 11 and a control circuit 12. In the memory section 11, source line wiring layers 21 and bit line wiring layers 22 are alternately stacked on a silicon substrate (not shown). The source line wiring layer 21 is composed of a plurality of source lines SL extending in a first direction. The bit line wiring layer 22 is composed of a plurality of bit lines BL extending in a second direction crossing (e.g., orthogonal to) the first direction.

Between each source line SL and each bit line BL, a memory cell 23 and a rectifying element 24 are series connected. The rectifying element 24 is e.g. a diode film for passing current in the direction from the bit line BL to the source line SL, and not passing current in the direction from the source line SL to the bit line BL.

The control circuit 12 applies a relatively positive potential to the bit line BL, and a relatively negative potential to the source line SL. Thus, the control circuit 12 can pass a current in the memory cell 23 connected between these bit line BL and source line SL. Here, the control circuit 12 can pass a current in an arbitrary memory cell 23 by selecting the bit line BL and the source line SL to be applied with the potential.

As shown in FIG. 2, in each memory cell 23, n (n being an integer of 2 or more) resistance change films 30 are stacked. Here, FIG. 2 shows an example of n being 3, and the resistance change films are labeled with reference numerals of "30_1", "30_2", and "30_3". The n resistance change films 30 are series connected to each other between the source line SL and the bit line BL. For instance, the resistance change films 30 are in contact with each other.

In the following, with reference to FIG. 2, an example of n being 3 is described.

In each of the resistance change films 30_1-30_3, a plurality of pairs of a GeTe layer 31 and a Sb$_2$Te$_3$ layer 32 are alternately stacked to form a superlattice film. The GeTe layer 31 is a crystal layer made of a chalcogen compound containing germanium (Ge) and tellurium (Te) at 1:1. The Sb$_2$Te$_3$ layer 32 is a crystal layer made of a chalcogen compound containing antimony (Sb) and tellurium (Te) at 2:3. The stacking direction of the GeTe layer 31 and the Sb$_2$Te$_3$ layer 32 is matched with the stacking direction of the resistance change films 30_1-30_3. The stacking direction of the GeTe layer 31 and the Sb$_2$Te$_3$ layer 32 is also matched with the arranging direction of the memory cell 23 and the rectifying element 24, and is also the direction in which the current flows during the operation of the memory device 1. Here, the aforementioned stacking direction may be inclined at an angle other than 90° with respect to the direction in which the current flows.

As shown in FIG. 3, each resistance change film 30 can be represented by the following chemical formula 1. In the following chemical formula 1, hi (i being an integer of 1-n) represents the number of repetitions of the unit crystal structure in each GeTe layer 31 of the resistance change film 30_i. ji represents the number of repetitions of the unit crystal structure in each Sb$_2$Te$_3$ layer 32 of the resistance change film 30_i. ki represents the number of repetitions of the stacked body composed of the GeTe layer 31 and the Sb$_2$Te$_3$ layer 32 in the resistance change film 30_i. That is, the total number of stacking of the GeTe layers 31 and the Sb$_2$Te$_3$ layers 32 in the resistance change film 30_i is 2ki.

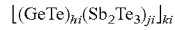
$$[(GeTe)_{hi}(Sb_2Te_3)_{ji}]_{ki} \qquad \text{[Chem. 1]}$$

Among the n resistance change films 30 constituting one memory cell 23, the factor hi is mutually different, and the factor ki is also mutually different. For instance, the resistance change film 30 having a smaller number of repetitions hi of the unit crystal structure in the GeTe layer 31, i.e., the resistance change film 30 including a thinner GeTe layer 31, has a larger number of repetitions ki of the stacked body composed of the GeTe layer 31 and the Sb$_2$Te$_3$ layer 32, i.e., a larger total number of stacking 2ki of the GeTe layers 31 and the Sb$_2$Te$_3$ layers 32. Furthermore, for instance, the number of repetitions ji of the unit crystal structure in the Sb$_2$Te$_3$ layer 32 is mutually equal. In the example shown in FIG. 2, h1<h2<h3, k1>k2>k3, and j1=j2=j3. Thus, the resistance change film 30 having a smaller factor hi and including a thinner GeTe layer 31 has a larger number of repetitions ki and a larger total number of stacking 2ki of the GeTe layers 31 and the Sb$_2$Te$_3$ layers 32. As an example, h1=2, h2=3, h3=4, and j1=j2=j3=4. Furthermore, the factors k1-k3 are determined by the resistance required for each resistance change film 30, and are in the range of 2-50. Thus, among the resistance change films 30, the factors ji are constant, whereas the factors hi are different. Accordingly, the ratio of the factor hi to the factor ji is mutually different. Thus, the average composition of the entire resistance change film 30 is mutually different. Furthermore, the arrangement pitch of the GeTe layers 31 is also mutually different.

Next, the operation of the memory device according to this embodiment configured as above is described.

First, the operation of one resistance change film is described.

FIGS. 4A and 4B are molecular model diagrams illustrating the crystal structure of the resistance change film. FIG. 4A shows a low resistance state, and FIG. 4B shows a high resistance state.

Figure 5:
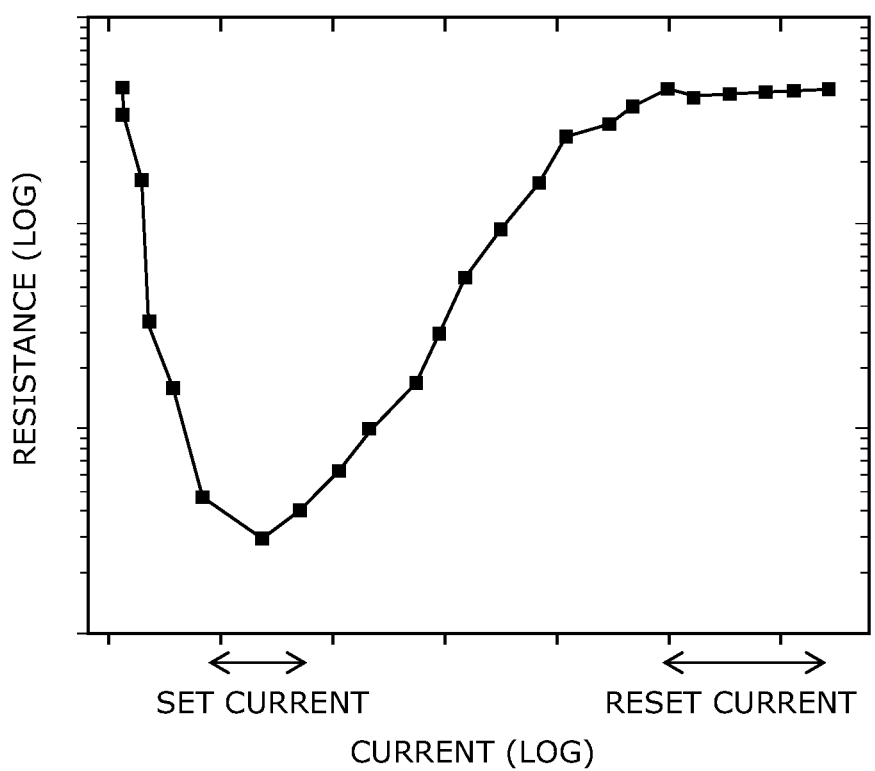
FIG. 5 is a graph illustrating the operation of the resistance change film.

FIG. 5 is a graph illustrating the operation of the resistance change film. The horizontal axis represents the current passed in the resistance change film, and the vertical axis represents the resistance of the resistance change film.

As shown in FIGS. 4A and 4B, the GeTe layer 31 can assume a low resistance state and a high resistance state. In the low resistance state, one germanium atom is coordinated with six tellurium atoms to make metallic bonding. In the high resistance state, one germanium atom is coordinated with four tellurium atoms to make covalent bonding. By passing a current along the stacking direction of the GeTe layer 31 and the Sb$_2$Te$_3$ layer 32 in the memory cell 23, the germanium atoms migrate in the GeTe layer 31 to change the superlattice structure. Thus, the GeTe layer 31 is reversibly transferred between the low resistance state and the high resistance state. Furthermore, by sandwiching the GeTe layer 31 between the Sb$_2$Te$_3$ layers 32, the transfer operation of the GeTe layer 31 is assisted.

As shown in FIG. 5, suppose that the resistance change film 30 is initially in the high resistance state shown in FIG. 4B, and a prescribed amount of current is passed in the resistance change film 30. Then, germanium atoms migrate in the GeTe layer 31 to change the coordination number from 4 to 6. Thus, the resistance change film 30 is transferred to the low resistance state shown in FIG. 4A. This operation is referred to as "set". The minimum amount of current causing set is referred to as "set current".

On the other hand, a prescribed amount of current is passed in the resistance change film 30 in the low resistance state. Then, germanium atoms migrate in the GeTe layer 31 to change the coordination number from 6 to 4. Thus, the resistance change film 30 is transferred to the high resistance state shown in FIG. 4B. This operation is referred to as "reset". The minimum amount of current causing reset is referred to as "reset current". For instance, the direction of the reset current is the same as the direction of the set current, and the amount of the reset current is larger than the amount of the set current. Furthermore, in set and reset, the crystallinity of the resistance change film 30 is not compromised, and the resistance change film 30 is not made noncrystalline, either.

Next, the operation of the memory cell is described.

As shown in FIG. 2, in the memory cell 23, n resistance change films 30 are series connected. Thus, the operation of the memory cell 23 is a combined operation of the n resistance change films 30.

Figure 6A:
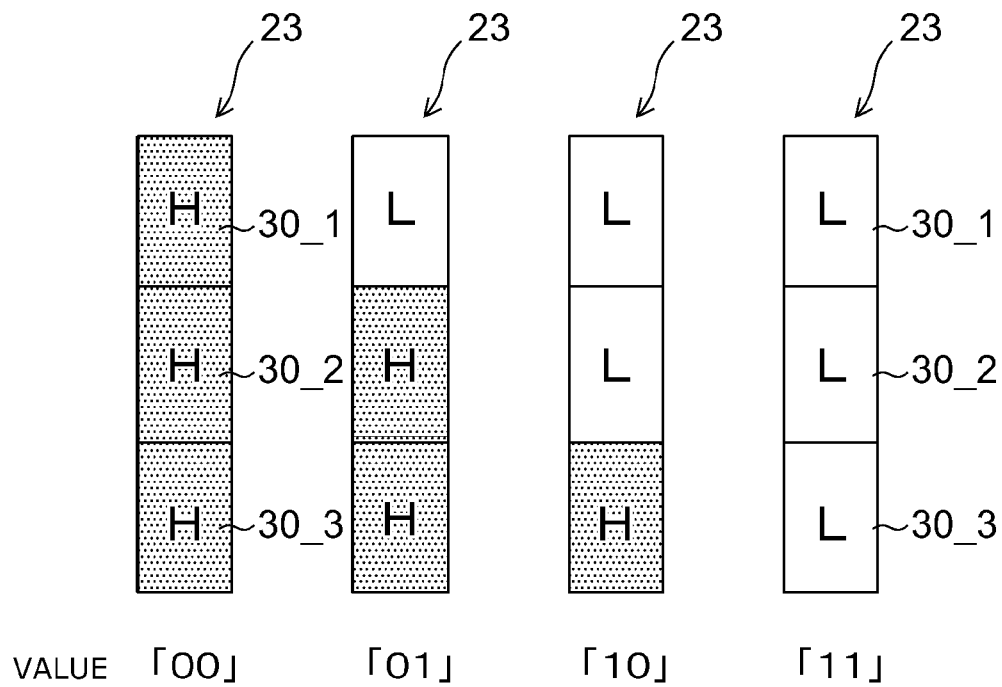
FIG. 6A shows the state of resistance change films of the memory cell.
Figure 6B:
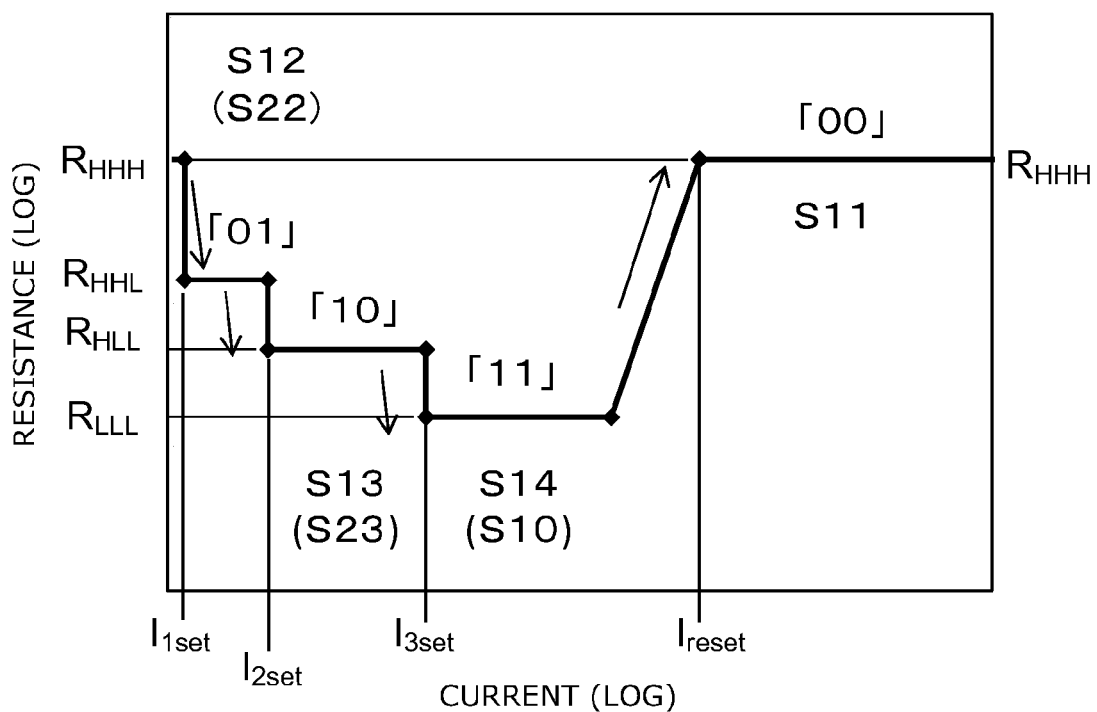
FIG. 6B is a graph illustrating a write operation of the memory cell.

FIG. 6A shows the state of resistance change films of the memory cell. FIG. 6B is a graph illustrating the write operation of the memory cell. The horizontal axis represents the current passed in the memory cell, and the vertical axis represents the resistance of the memory cell.

In the memory cell 23, n resistance change films 30 are series connected. Thus, a current having the same magnitude flows in the n resistance change films 30 belonging to the same memory cell 23. Furthermore, in the resistance change film 30 represented by the above chemical formula 1, the resistance change film 30 having a smaller number of repetitions hi of the unit crystal structure in the GeTe layer 31 has a smaller set current. Thus, in the memory cell 23 with all the resistance change films 30 in the high resistance state, when the current passed in this memory cell 23 is continuously increased from zero, the resistance change films 30 are sequentially set and transferred to the low resistance state so that the resistance change film 30 having a smaller set current, i.e., the resistance change film 30 having smaller hi, is set earlier.

Furthermore, in the resistance change film 30 represented by the above chemical formula 1, the resistance change film 30 having a larger total number of stacking (2ki) of the GeTe layers 31 and the $Sb_2Te_3$ layers 32 has a higher resistance in the high resistance state. In general, in a superlattice film, the resistance in the low resistance state is significantly lower than the resistance in the high resistance state, and hence is substantially negligible. Thus, the resistance change film 30 having a larger factor ki has a larger difference between the resistance in the high resistance state and the resistance in the low resistance state (hereinafter referred to as "resistance difference").

In the example shown in FIG. 2, h1<h2<h3 and k1>k2>k3. Thus, the resistance change film 30_1 has the smallest set current and the largest resistance difference. The resistance change film 30_2 has the next smallest set current and the next largest resistance difference. Finally, the resistance change film 30_3 has the largest set current and the smallest resistance difference.

For the resistance change film 30_1, the set current is denoted by $I_{1set}$, the resistance in the high resistance state is denoted by $r_{1H}$, and the resistance in the low resistance state is denoted by $r_{1L}$. For the resistance change film 30_2, the set current is denoted by $I_{2set}$, the resistance in the high resistance state is denoted by $r_{2H}$, and the resistance in the low resistance state is denoted by $r_{2L}$. For the resistance change film 30_3, the set current is denoted by $I_{3set}$, the resistance in the high resistance state is denoted by $r_{3H}$, and the resistance in the low resistance state is denoted by $r_{3L}$. The reset current of each resistance change film 30 is denoted by $I_{reset}$. Then, the following mathematical formulas 1 and 2 hold. Actually, the reset current of the resistance change films 30_1-30_3 is also mutually different. However, the reset current in any case is larger than $I_{3set}$. Thus, in this embodiment, it is assumed that the reset current of the resistance change films 30 is equal.

$$I_{1set} < I_{2set} < I_{3set} < I_{reset} \quad \text{[Math. 1]}$$

$$r_{1H} - r_{1L} > r_{2H} - r_{2L} > r_{3H} - r_{3L} \quad \text{[Math. 2]}$$

Thus, when the current passed in the memory cell 23 is continuously increased from zero, the memory cell 23 is operated as follows. In the following, the resistance of the entire memory cell is denoted by $R_{(state\ of\ resistance\ change\ film\ 30\_3)(state\ of\ resistance\ change\ film\ 30\_2)(state\ of\ resistance\ change\ film\ 30\_1)}$.

As shown in FIGS. 6A and 6B, suppose a memory cell 23 with all the resistance change films 30 in the high resistance state (H). The resistance of this memory cell 23 is $R_{HHH}$. This memory cell 23 is assigned with value "00".

Then, the current passed in this memory cell 23 is continuously increased from zero. When the current reaches $I_{1set}$, the resistance change film 30_1 having the smallest set current is set and transferred to the low resistance state (L). At this time, the resistance change films 30_2 and 30_3 remain in the high resistance state (H). Thus, the resistance of the memory cell 23 becomes $R_{HHL}$, where $R_{HHL} < R_{HHH}$. This memory cell 23 is assigned with value "01".

The current is further increased. When the current reaches $I_{2set}$, the resistance change film 30_2 having the second smallest set current is set and transferred to the low resistance state (L). At this time, the resistance change film 30_1 has already been in the low resistance state (L), and the resistance change film 30_3 remains in the high resistance state (H). Thus, the resistance of the memory cell 23 becomes $R_{HLL}$, where $R_{HLL} < R_{HHL}$. This memory cell 23 is assigned with value "10".

The current is further increased. When the current reaches $I_{3set}$, the resistance change film 30_3 having the third smallest set current is set and transferred to the low resistance state (L). At this time, the resistance change films 30_1 and 30_2 have already been in the low resistance state (L). Thus, the resistance of the memory cell 23 becomes $R_{LLL}$, where $R_{LLL} < R_{HLL}$. This memory cell 23 is assigned with value "11".

The current is further increased. When the current flowing in the memory cell 23 reaches $I_{reset}$, the resistance change films 30_1, 30_2, and 30_3 are reset and transferred to the high resistance state (H). Thus, the resistance of the memory cell 23 returns to $R_{HHH}$, and the value of the memory cell 23 returns to "00".

Thus, the memory cell 23 can store values of four levels "00", "01", "10", and "11" by making the set currents of three resistance change films 30 different from each other. Put more generally, values of n+1 levels can be stored by n resistance change films 30 having mutually different set currents.

Here, the entire memory cell 23 can be regarded as one superlattice film. In this case, the superlattice film constituting the memory cell 23 is a film capable of assuming the low resistance state and the high resistance state. In this superlattice film, it can be supposed that n regions are arranged along the direction of the current flowing in the superlattice film, i.e., the aforementioned stacking direction. For instance, in the case of n=3, a first region corresponding to the resistance change film 30_1, a second region corresponding to the resistance change film 30_2, and a third region corresponding to the resistance change film 30_3 can be supposed.

The set current at which the first region is transferred from the high resistance state to the low resistance state is smaller than the set current at which the second region is transferred from the high resistance state to the low resistance state. The set current at which the second region is transferred from the high resistance state to the low resistance state is smaller than the set current at which the third region is transferred from the high resistance state to the low resistance state. Thus, when the memory cell 23 is entirely in the high resistance state, if the current passed in the memory cell 23 is continuously increased from zero, the timing at which each region is set is mutually different. The regions are set in the order of the first region, the second region, and the third region. Furthermore, the difference between the resistance in the high resistance state and the resistance in the low resistance state (resistance difference) in the first region is larger than the resistance difference in the second region. The resistance difference in the second region is larger than the resistance difference in the third region.

Next, the write operation of the memory device 1 is described.

Figure 7:
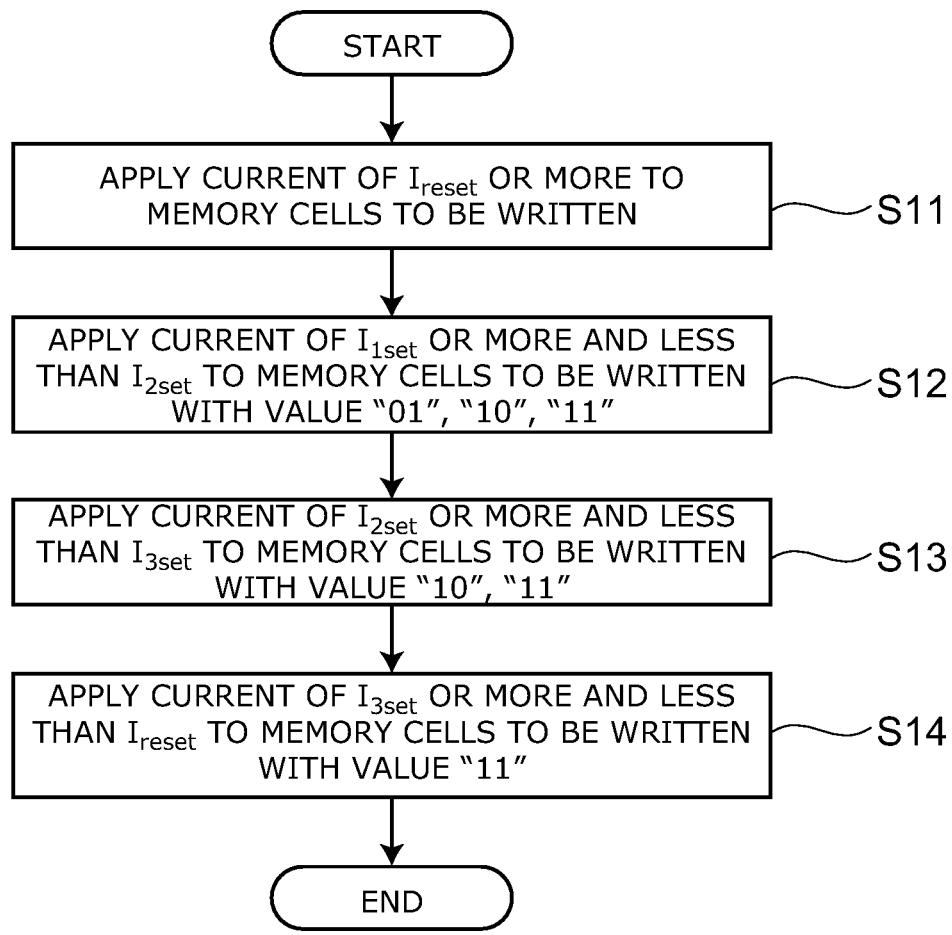
FIG. 7 is a flow chart illustrating the write operation of the memory device according to the embodiment.

FIG. 7 is a flow chart illustrating the write operation of the memory device according to this embodiment.

First, as shown in FIGS. 6A and 6B and step S11 of FIG. 7, the control circuit 12 passes a current more than or equal to $I_{reset}$ in all the memory cells 23 to be written. Thus, the resistance change films 30_1-30_3 are all reset and turned into the high resistance state (H). Accordingly, the value "00" is written to the memory cells 23.

Next, as shown in step S12, the control circuit 12 passes a current more than or equal to $I_{1set}$ and less than $I_{2set}$ in the memory cells 23 to be written with the value "01", "10", or "11". Thus, in these memory cells 23, the resistance change film 30_1 is set and turned into the low resistance state (L). Accordingly, the memory cells 23 assume the value "01".

Next, as shown in step S13, the control circuit 12 passes a current more than or equal to $I_{2set}$ and less than $I_{3set}$ in the memory cells 23 to be written with the value "10" or "11". Thus, in these memory cells 23, the resistance change film 30_2 is set and turned into the low resistance state (L). Accordingly, the memory cells 23 assume the value "10".

Next, as shown in step S14, the control circuit 12 passes a current more than or equal to $I_{3set}$ and less than $I_{reset}$ in the memory cells 23 to be written with the value "11". Thus, in these memory cells 23, the resistance change film 30_3 is set and turned into the low resistance state (L). Accordingly, the memory cells 23 assume the value "11".

By the above operation, intended values are written to all the memory cells 23 to be written.

Then, the control circuit 12 passes a current in each memory cell 23 to detect the resistance of the entire memory cell 23. Thus, the control circuit 12 can read the value stored in the memory cell 23. The voltage applied to the memory cell 23 in the read operation is made lower than the voltage applied to the memory cell 23 in the write operation. Thus, normally, the value of the memory cell 23 is not changed by the read operation.

In the resistance change film made of a superlattice stacked body (iPCM), the voltage-current characteristic is different between in the write operation and in the read operation. In the write operation (under high voltage application), the voltage-current characteristic of the resistance change film is nearly linear (ohmic). In the read operation (under low voltage application), the voltage-current characteristic of the resistance change film is non-linear (non-ohmic).

Next, the effect of this embodiment is described.

In the memory device according to this embodiment, in each memory cell, n resistance change films having mutually different set currents are series connected. Thus, the resistance change films can be set one by one and transferred from the high resistance state to the low resistance state. As a result, values of n+1 levels can be stored in the n resistance change films. Thus, the memory device according to this embodiment has high recording density.

Furthermore, in the memory device according to this embodiment, in each memory cell, the current passed in the memory cell is continuously increased from zero. Here, the resistance change film having a smaller set current and set earlier is provided with a larger difference between the resistance in the high resistance state and the resistance in the low resistance state (resistance difference). Thus, the resistance ratio between the resistances before and after the set operation in the resistance change films (hereinafter simply referred to as "resistance ratio") can be matched with each other in the entire memory cell. That is, the relationship shown in the following mathematical formula 3 can be realized.

$$\frac{R_{HHH}}{R_{HHL}} \approx \frac{R_{HHL}}{R_{HLL}} \approx \frac{R_{HLL}}{R_{LLL}} \qquad [\text{Math. 3}]$$

If the resistance difference is comparable among the resistance change films, the resistance ratio is larger in a later set operation because the resistance of the entire memory cell is smaller in the later set operation. Conversely, in an earlier set operation, the resistance of the entire memory cell is larger. Thus, it is difficult to ensure sufficient resistance ratio. This decreases the margin of the read operation. Thus, in this embodiment, the resistance difference is made larger in the resistance change film set earlier to make the resistance ratio uniform. Here, the vertical axis of FIG. 6B is represented in a logarithmic scale. Thus, the length along the vertical axis corresponds to the magnitude of the resistance ratio.

In the following, this effect is described in detail.

As shown in FIGS. 2, 6A, and 6B, for n=3, the condition allowing the resistance ratio of the resistance change films to be made uniform is considered. The following consideration supposes a case where the resistance difference is mutually different among three resistance change films constituting one memory cell. In such a case, it is considered in which order the resistance change films should be set to make the resistance ratio uniform.

First, it is assumed that the first-layer resistance change film has the largest resistance difference, the second-layer resistance change film has the next largest resistance difference, and the third-layer resistance change film has the smallest resistance difference. In this case, the relationship among the ratios of the resistance $R_{HHL}$, $R_{HLH}$, and $R_{LHH}$ of the entire memory cell with only one resistance change film in the low resistance state versus the resistance $R_{HHH}$ of the entire memory cell with all the resistance change films in the high resistance state (H) satisfies the following mathematical formula 4.

$$\frac{R_{HHL}}{R_{HHH}} < \frac{R_{HLH}}{R_{HHH}} < \frac{R_{LHH}}{R_{HHH}} \qquad [\text{Math. 4}]$$

To realize the above mathematical formula 4, the following mathematical formula 5 needs to be satisfied.

$$r_{1H}-r_{1L}>r_{2H}-r_{2L}>r_{3H}-r_{3L} \qquad [\text{Math. 5}]$$

Here, from the characteristics of iPCM, the following mathematical formula 6 generally holds.

$$r_{iH}>>r_{iL} \qquad [\text{Math. 6}]$$

From the above mathematical formulas 5 and 6, it is found preferable that to realize uniform resistance ratio, the resistance change films be set sequentially from the resistance change film having the highest resistance in the high resistance state. However, this is not the case if the above mathematical formula 6 does not hold.

Similarly, the relationship between the resistance ratios after the first-layer resistance change film is set is represented by the following mathematical formula 7.

$$\frac{R_{HLL}}{R_{HHL}} < \frac{R_{LHL}}{R_{HHL}} \qquad [\text{Math. 7}]$$

To realize the above mathematical formula 7, the following mathematical formula 8 needs to be satisfied.

$$r_{2H}-r_{2L}>r_{3H}-r_{3L} \qquad [\text{Math. 8}]$$

Summarizing the above consideration, to make the resistance ratio uniform, it is preferable that the resistance change films be set sequentially from the resistance change film having the largest resistance difference.

On the other hand, from the viewpoint of voltage distribution in the write operation, it is preferable that the resistance change film set earlier have higher resistance in the low resistance state. That is, denoting the resistance in the write operation by $r^W_{(layer)(resistance\ state)}$, the following mathematical formula 9 holds.

$$r_{1L}^W>r_{2L}^W>r_{3L}^W \qquad [\text{Math. 9}]$$

It is assumed that the magnitude relationship between the resistances of the low resistance state in the write operation corresponds to the magnitude relationship between the resistances of the low resistance state in the read operation. Then, the following mathematical formula 10 holds.

$$r_{1L}>r_{2L}>r_{3L} \qquad [\text{Math. 10}]$$

Summarizing the foregoing, in view of the relationship of resistance ratios in the read operation and the relationship of resistance distribution in the write operation, it is preferable to satisfy both the above mathematical formulas 5 and 10. To this end, as shown in the following mathematical formula 11, it is preferable that the resistance change films be set sequentially from the resistance change film having the highest resistance in the high resistance state in the read operation.

$$r_{1H}>r_{2H}>r_{3H} \qquad [\text{Math. 11}]$$

Next, a second embodiment is described.

This embodiment is different from the above first embodiment in that in the write operation, the value of the memory cell is not increased one by one, but the intended value is written at once from the value "00".

Figure 8:
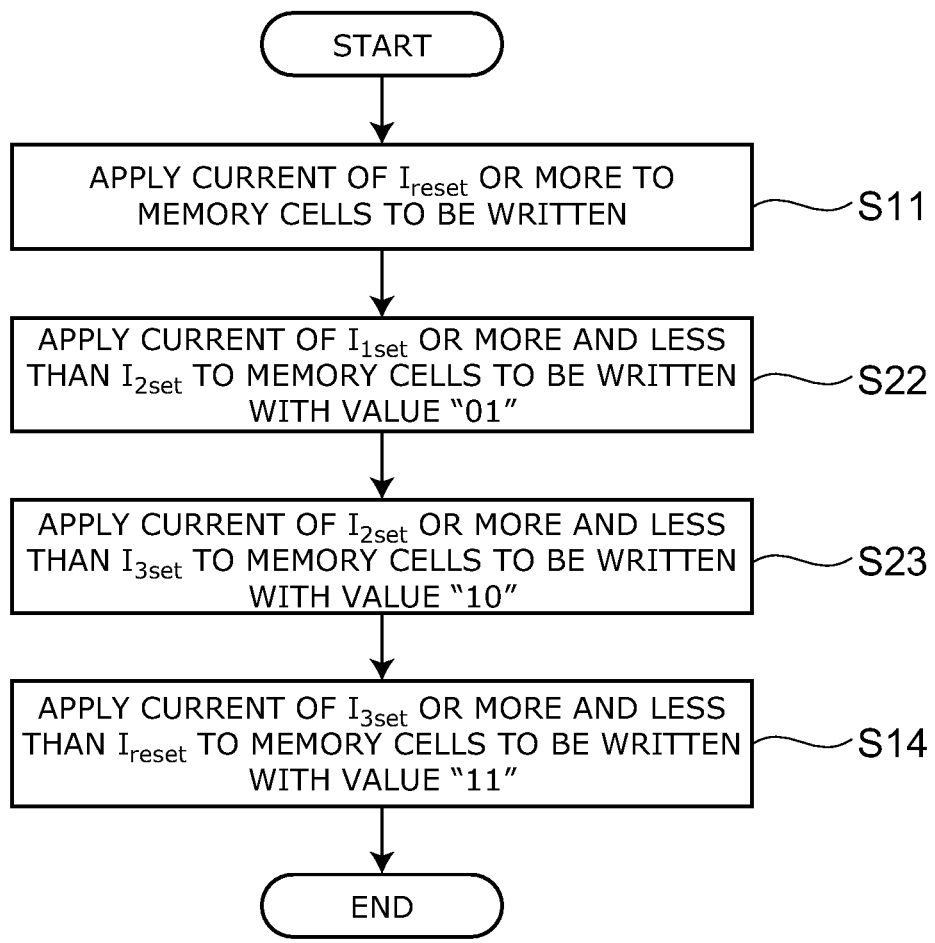
FIG. 8 is a flow chart illustrating the write operation of the memory device according to the embodiment.

FIG. 8 is a flow chart illustrating the write operation of the memory device according to this embodiment.

First, as shown in FIGS. 6A and 6B and step S11 of FIG. 8, similarly to the above first embodiment, the control circuit 12 (see FIG. 1) passes a current more than or equal to $I_{reset}$ in all the memory cells to be written. Thus, all the resistance change films belonging to each memory cell are turned into the high resistance state (H). That is, all the memory cells to be written are assigned the value "00".

Next, as shown in step S22, the control circuit 12 passes a current more than or equal to $I_{1set}$ and less than $I_{2set}$ in only the memory cell to be written with the value "01". Thus, the resistance change film 30_1 of this memory cell is set and written with the value "01". At this time, the value of the memory cell to be written with the value "10" or "11" remains "00".

Next, as shown in step S23, the control circuit 12 passes a current more than or equal to $I_{2set}$ and less than $I_{3set}$ in only the memory cell to be written with the value "10". Thus, the resistance change films 30_1 and 30_2 of this memory cell 23 are set and written with the value "10". At this time, the value of the memory cell to be written with the value "11" remains "00".

Next, as shown in step S14, the control circuit 12 passes a current more than or equal to $I_{3set}$ and less than $I_{reset}$ in the memory cell 23 to be written with the value "11". Thus, the resistance change films 30_1, 30_2, and 30_3 of this memory cell are set and written with the value "11".

By the above operation, intended values are written to all the memory cells.

The configuration, operation, and effect of this embodiment other than the foregoing are similar to those of the above first embodiment.

Next, a third embodiment is described.

Figure 9:
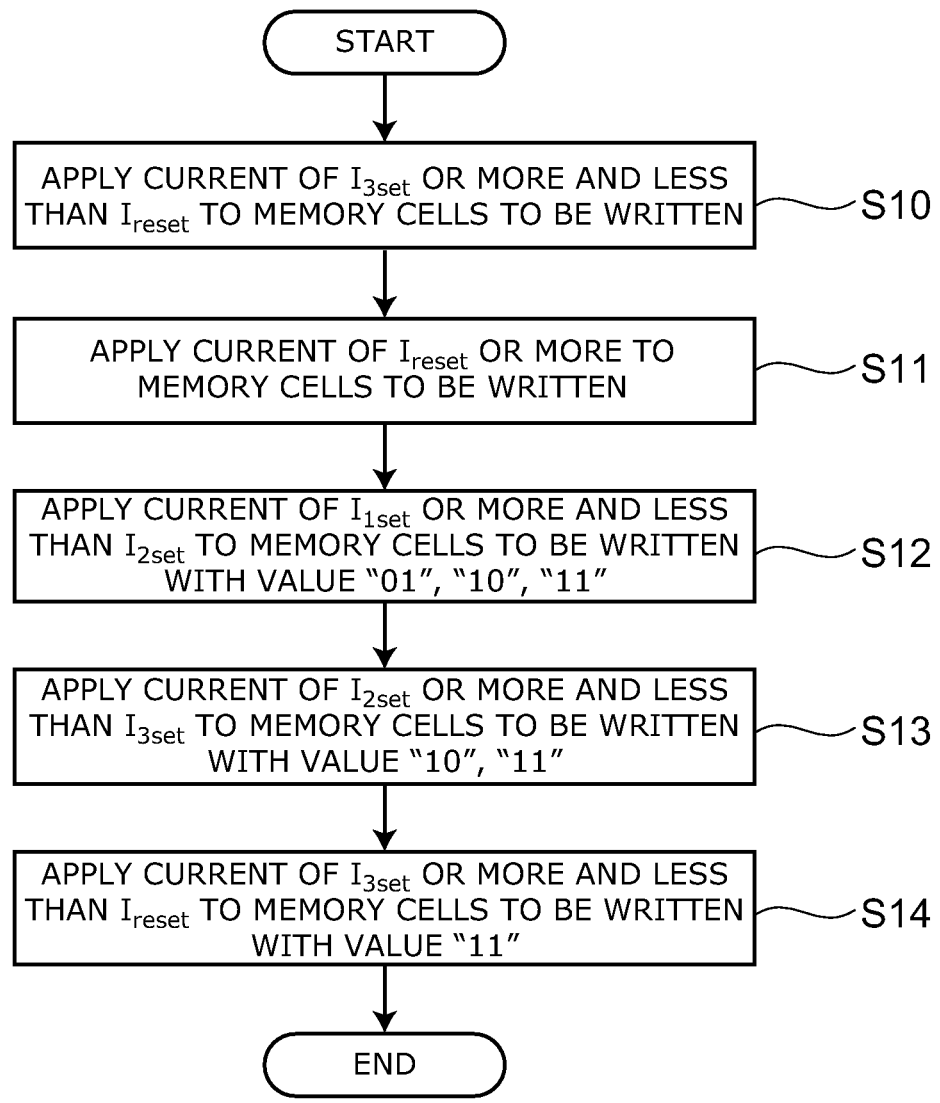
FIG. 9 is a flow chart illustrating the write operation of the memory device according to the embodiment.

FIG. 9 is a flow chart illustrating the write operation of the memory device according to this embodiment.

This embodiment is different from the above first embodiment in that before all the resistance change films in the memory cell to be written are turned into the high resistance state (H), all the resistance change films are turned into the low resistance state (L).

First, as shown in FIGS. 6A and 6B and step S10 of FIG. 9, the control circuit 12 passes a current more than or equal to $I_{3set}$ and less than $I_{reset}$ in all the memory cells to be written. Thus, the resistance change films 30_1, 30_2, and 30_3 of this memory cell are set and turned into the low resistance state (L). As a result, the resistance of the entire memory cell is placed at the lowest level. That is, all the memory cells to be written are written with the value "11".

The subsequent writing method is similar to the above first embodiment. That is, as shown in step S11, a current more than or equal to $I_{reset}$ is passed in all the memory cells to be written to reset all the resistance change films. Next, as shown in steps S12-S14, the resistance change films are sequentially set to write intended values. Here, the values may be written by the method of the above second embodiment.

According to this embodiment, before a current more than or equal to $I_{reset}$ is passed in all the memory cells in the process shown in step S11, all the resistance change films are turned into the low resistance state (L) in the process shown in step S10. This can reduce the voltage needed to pass a current more than or equal to $I_{reset}$ in the memory cell in the process shown in step S11. As a result, the occurrence of memory cells being insufficiently reset can be suppressed.

The configuration, operation, and effect of this embodiment other than the foregoing are similar to those of the above first embodiment.

Next, a fourth embodiment is described.

This embodiment is different from the above first embodiment in that values of two levels are recorded in each memory cell.

Figure 10:
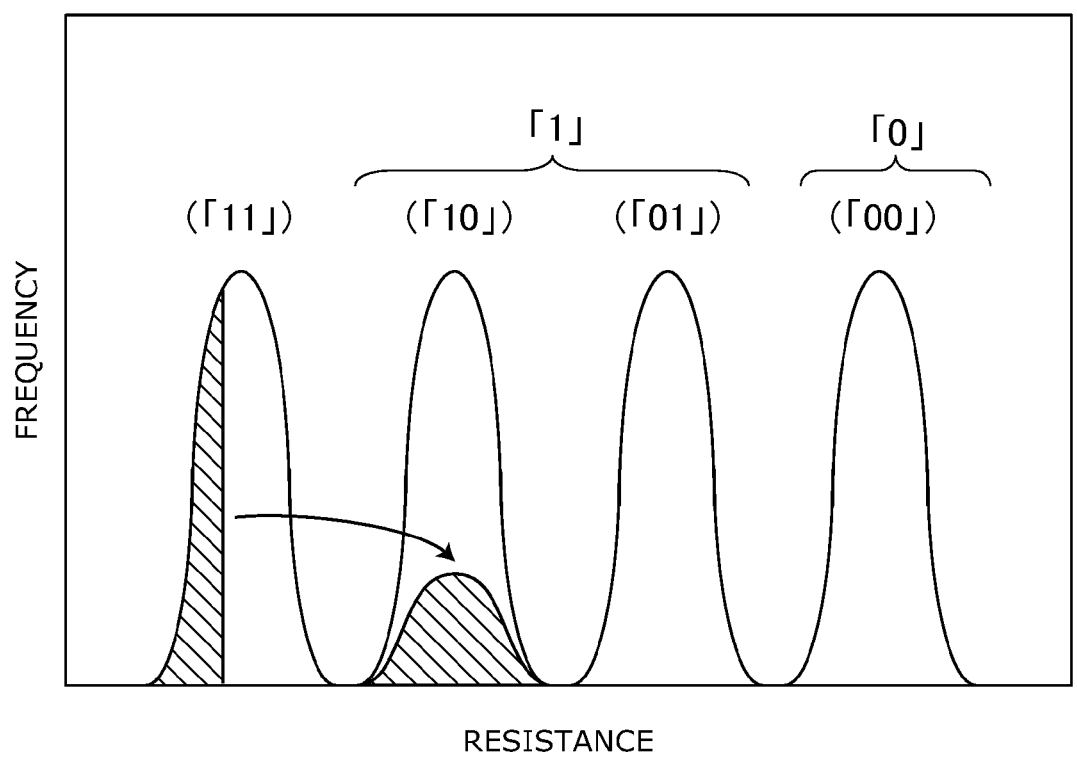
FIG. 10 is a graph illustrating a resistance distribution of the memory cell in the embodiment.

FIG. 10 is a graph illustrating the resistance distribution of a memory cell in this embodiment. The horizontal axis represents the resistance of the memory cell, and the vertical axis represents the frequency.

As shown in FIG. 10, in a memory cell capable of recording values of four levels, the resistance distributions corresponding to the respective values are separated from each other. However, in the memory section 11 (see FIG. 1), large variation may occur in constituent factors such as the composition and characteristics of materials constituting the memory cell and the size of each portion of the memory cell. Then, the variation in resistance is also increased. Large variation in resistance also results in large variation in the current flowing in each memory cell under application of the same voltage. Thus, when the read current is passed in the memory cells, among the memory cells recorded with the value "11" corresponding to the lowest resistance, a current more than or equal to $I_{reset}$ may flow in the memory cell having particularly low resistance, and the resistance change film may be erroneously set. This phenomenon is called "read disturb". Then, as shown by hatching in FIG. 10, in part of the memory cells with the resistance at the lowest level, i.e., the memory cells written with the value "11", the value is rewritten from "11" to "10".

Thus, in this embodiment, the control circuit 12 does not associate the state of all the n resistance change films 30 turned into the low resistance state with the value recorded in the memory cell. That is, the control circuit 12 does not use the value "11", but uses only the values "00", "01", and "10". Then, for instance, the values "10" and "01" are assigned to the value "1", and the value "00" is assigned to the value "0". Thus, these values are treated as 1-bit data. This can expand the margin for read disturb. Here, the value "10" may be assigned to the value "1", and the values "01" and "00" may be assigned to the value "0". Alternatively, besides the value "11", use of the value "01" may also be avoided. Thus, the value "10" may be assigned to the value "1", and the value "00" may be assigned to the value "0". Accordingly, the resistance distributions are greatly separated from each other, and the margin of the read operation is increased.

This embodiment can ensure the reliability of the memory cell even in the case where read disturb is likely to occur due to variation in the constituent factors of the memory cell.

The configuration, operation, and effect of this embodiment other than the foregoing are similar to those of the above first embodiment.

Next, a fifth embodiment is described.

Figure 11:
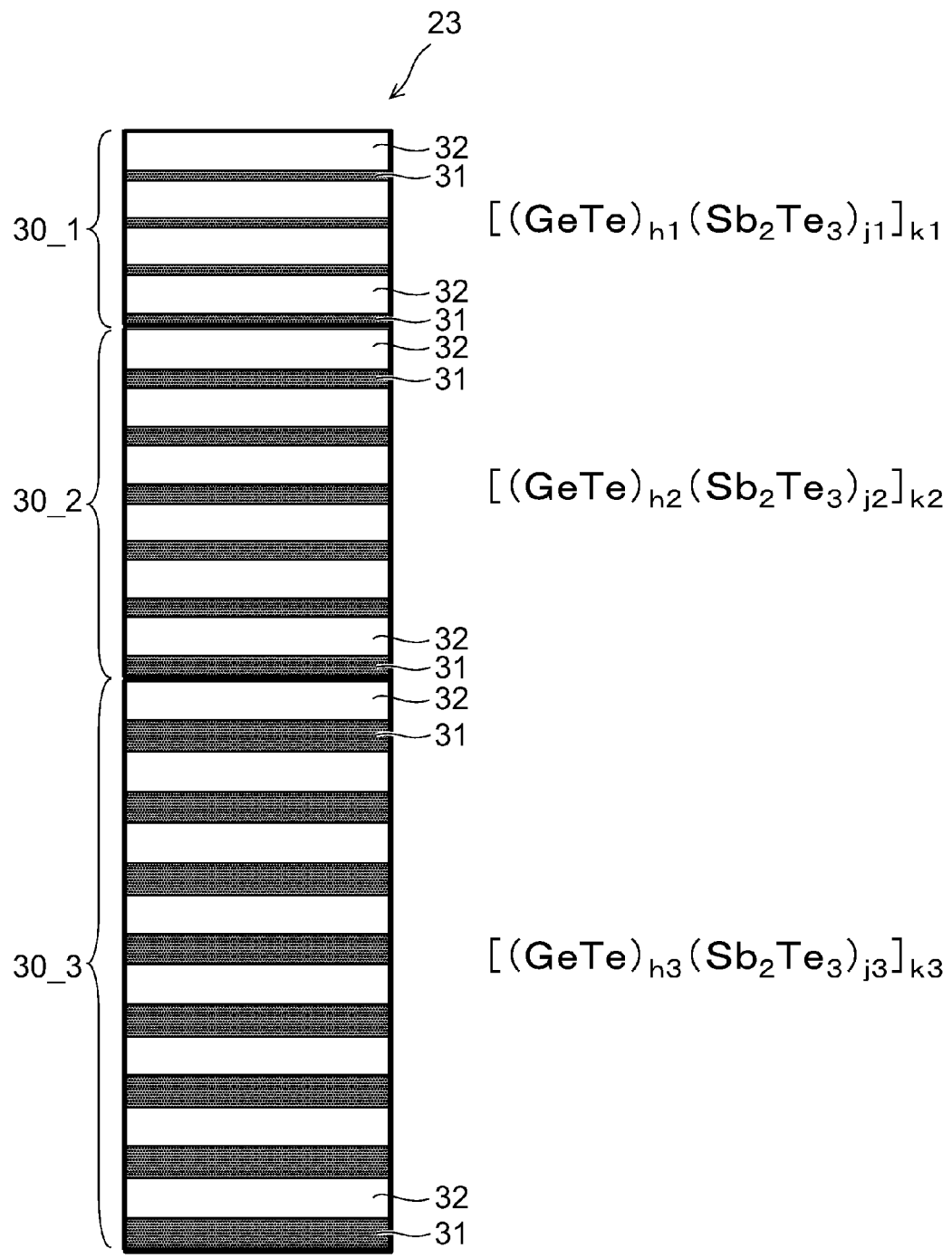
FIG. 11 is a sectional view illustrating a memory cell of the embodiment.

FIG. 11 is a sectional view illustrating a memory cell of this embodiment.

As shown in FIG. 11, in this embodiment, among the n resistance change films 30 belonging to each memory cell 23, the resistance change film 30 including a thinner GeTe layer 31, i.e., the resistance change film 30 having a smaller number of repetitions hi of the unit crystal structure in the GeTe layer 31, has a smaller number of repetitions ki of the stacked body composed of the GeTe layer 31 and the $Sb_2Te_3$ layer 32. That is, in the example shown in FIG. 11, h1<h2<h3 and k1<k2<k3.

In the resistance change film 30 with smaller hi, the reset current is smaller. Thus, in this embodiment, unlike the above first embodiment, the reset current is mutually different among the n resistance change films 30 belonging to each memory cell. Furthermore, the resistance change film 30 having a smaller number of repetitions ki has a smaller difference (resistance difference) between the resistance of the high resistance state (H) and the resistance of the low resistance state (L). Thus, in each memory cell, the resistance change film having a smaller reset current has a smaller resistance difference. The reset currents of the resistance change films 30_1, 30_2, and 30_3 are denoted by $I_{1reset}$, $I_{2reset}$, and $I_{3reset}$, respectively, and the set current of each resistance change film 30 is denoted by $I_{set}$. Then, the following mathematical formulas 12 and 13 hold. Actually, the set current of the resistance change films 30_1-30_3 is also mutually different. However, the set current in any case is smaller than $I_{1reset}$. Thus, in this embodiment, it is assumed that the set current of the resistance change films 30 is equal.

$$I_{set} < I_{1reset} < I_{2reset} < I_{3reset} \quad \text{[Math. 12]}$$

$$r_{1H} - r_{1L} < r_{2H} - r_{2L} < r_{3H} - r_{3L} \quad \text{[Math. 13]}$$

Next, the operation of the memory device according to this embodiment is described.

Figure 12A:
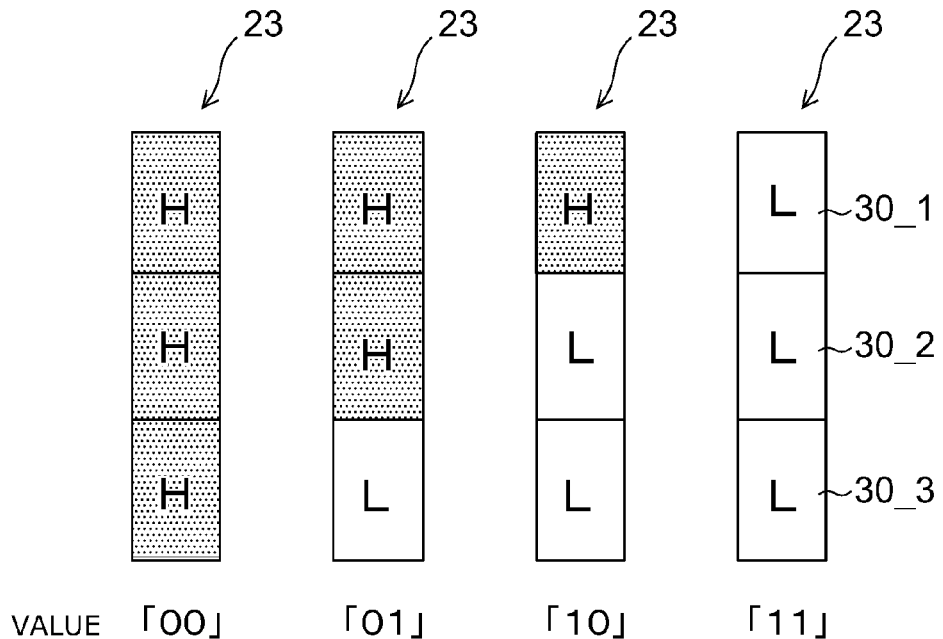
FIG. 12A shows a state of each resistance change film in one memory cell.
Figure 12B:
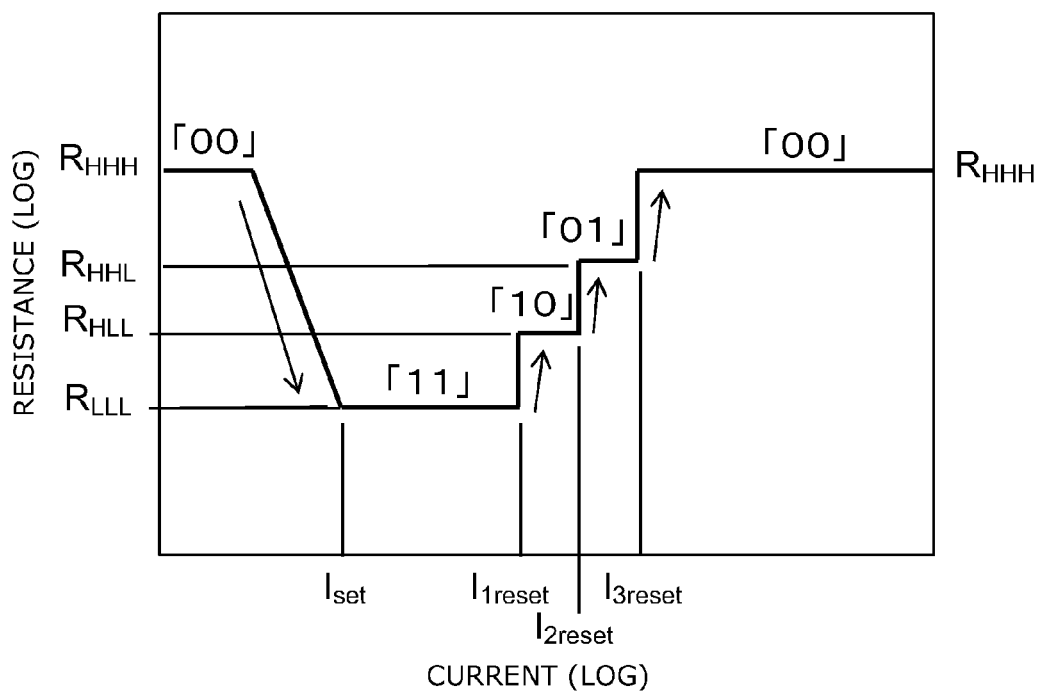
FIG. 12B is a graph illustrating the write operation of the memory cell in the embodiment.

FIG. 12A shows the state of each resistance change film in one memory cell. FIG. 12B is a graph illustrating the write operation of the memory cell in this embodiment. The horizontal axis represents the current passed in the memory cell, and the vertical axis represents the resistance of the memory cell.

As shown in FIGS. 12A and 12B, in this embodiment, in the write operation, first, a current more than or equal to $I_{set}$ and less than $I_{1reset}$ is passed in all the memory cells to be written. Thus, all the resistance change films 30_1-30_3 are set and turned into the low resistance state (L). Accordingly, all the memory cells to be written are written with the value "11". Next, a current more than or equal to $I_{1reset}$ and less than $I_{2reset}$ is passed in the memory cells to be written with the value "10", "01", or "00" to reset the resistance change film 30_1. Thus, these memory cells are written with the value "10". Next, a current more than or equal to $I_{2reset}$ and less than $I_{3reset}$ is passed in the memory cells to be written with the value "01" or "00" to reset the resistance change film 30_2. Thus, these memory cells are written with the value "01". Next, a current more than or equal to $I_{3reset}$ is passed in the memory cells to be written with the value "00" to reset the resistance change film 30_3. Thus, these memory cells are written with the value "00". Accordingly, intended values are written to all the memory cells to be written.

In this embodiment, the resistance change film having a smaller reset current has a smaller resistance difference. Thus, after all the resistance change films are turned into the low resistance state, the resistance difference of the resistance change film reset at an earlier stage, i.e., at the stage when the resistance of the entire memory cell is relatively lower, is relatively smaller. On the other hand, the resistance difference of the resistance change film reset at a later stage, i.e., at the stage when the resistance of the entire memory cell is relatively higher, is relatively larger. Thus, the resistance ratio between the resistances before and after reset can be made uniform.

The configuration, operation, and effect of this embodiment other than the foregoing are similar to those of the above first embodiment. In this embodiment, pursuant to the above second embodiment, instead of increasing the value of the memory cell one by one, the intended value may be written at once from the value "11". Alternatively, as in the fourth embodiment, values of two levels may be recorded in each memory cell.

In the examples of the above embodiments, the thickness of the GeTe layer is made different to make the set current or reset current different among the resistance change films. However, the embodiments are not limited thereto. Alternatively, the composition of the GeTe layer or the $Sb_2Te_3$ layer may be made different among the resistance change films. For instance, the composition ratio between germanium and tellurium may be made different in the GeTe layer. Furthermore, another kind of element may be introduced. Moreover, replacement by another element is allowed as long as the stacked body can form a superlattice film. For instance, germanium in the GeTe layer may be all replaced by another element. Also in these cases, as in the case of making the thickness of the GeTe layer different, the average composition of the entire resistance change film is different among the resistance change films. In the case where the thickness of the $Sb_2Te_3$ layer is made different at the same ratio as the thickness of the GeTe layer, the average composition of the entire resistance change film is equal among the resistance change films. However, in this case, the stacking pitch of the GeTe layers and the $Sb_2Te_3$ layers is different. Also by such approaches, the set current or reset current can be made different among the resistance change films.

The embodiments described above can realize a memory device having high recording density.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising n (n being an integer of 2 or more) resistance change films being series connected to each other,
   each of the resistance change films being a superlattice film in which a plurality of pairs of a first crystal layer made of a first compound and a second crystal layer made of a second compound are alternately stacked, and
   an average composition of the entire resistance change film or an arrangement pitch of the first crystal layers and the second crystal layers being mutually different among the n resistance change films.

2. The device according to claim 1, wherein the n resistance change films are stacked so as to form a superlattice film.

3. The device according to claim 1, wherein a thickness of the first crystal layer is mutually different among the n resistance change films.

4. The device according to claim 3, wherein the resistance change film with the first crystal layer being thinner has a larger total number of stacking of the first crystal layers and the second crystal layers.

5. The device according to claim 1, wherein the first compound is GeTe, and the second compound is $Sb_2Te_3$.

6. The device according to claim 1, wherein n is 3.

7. A memory device comprising:
   a superlattice film capable of assuming a low resistance state and a high resistance state, wherein:
   the superlattice film includes a first region and a second region which are arranged along a direction of current flowing in the superlattice film,
   at least one of a first set current at which the first region is transferred from the high resistance state to the low resistance state and a first reset current at which the first region is transferred from the low resistance state to the high resistance state is different from at least one of a second set current at which the second region is transferred from the high resistance state to the low resistance state and a second reset current at which the second region is transferred from the low resistance state to the high resistance state,
   in the superlattice film, first crystal layers made of a first compound and second crystal layers made of a second compound are alternately stacked along the direction,
   the first crystal layers in the first region are thinner than the first crystal layers in the second region, and
   a total number of stacking of the first crystal layers and the second crystal layers in the first region is larger than the number of stacking in the second region.

8. The device according to claim 7, wherein the first compound is GeTe, and the second compound is $Sb_2Te_3$.

* * * * *